US006531345B2

(12) United States Patent
Farnworth et al.

(10) Patent No.: US 6,531,345 B2
(45) Date of Patent: Mar. 11, 2003

(54) METHOD AND APPARATUS FOR FABRICATING ELECTRONIC DEVICE

(75) Inventors: Warren M. Farnworth, Nampa, ID (US); Kevin G. Duesman, Boise, ID (US); Alan G. Wood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/917,695

(22) Filed: Jul. 31, 2001

(65) Prior Publication Data

US 2001/0044162 A1 Nov. 22, 2001

Related U.S. Application Data

(60) Continuation of application No. 09/396,439, filed on Sep. 15, 1999, now Pat. No. 6,326,245, which is a division of application No. 09/039,230, filed on Mar. 16, 1998, now Pat. No. 6,093,933.

(51) Int. Cl.[7] ................................................ H01L 21/82
(52) U.S. Cl. ........................ 438/130; 438/132; 438/238
(58) Field of Search ................................. 438/130, 132, 438/238, FOR 212, FOR 434

(56) References Cited

U.S. PATENT DOCUMENTS 3,771,217 A   11/1973   Hartman
3,813,650 A *  5/1974   Hunter ........................ 326/106
3,839,781 A   10/1974   Russell
4,859,806 A    8/1989   Smith
5,214,657 A    5/1993   Farnworth et al.
5,324,681 A    6/1994   Lowrey et al.
5,485,102 A    1/1996   Cliff et al.
5,691,949 A   11/1997   Hively et al.
5,748,872 A    5/1998   Norman
5,973,340 A   10/1999   Mohsen

* cited by examiner

Primary Examiner—Long Pham
Assistant Examiner—Michelle Estrada
(74) Attorney, Agent, or Firm—Dickstein Shapiro Morin & Oshinsky LLP

(57) ABSTRACT

Logic circuitry formed in street areas between adjacent fabricated electronic devices may be used as auxiliary or redundant components to salvage one or more otherwise defective devices. Logic circuitry is selectively coupled to the defective device(s) to directly replace or facilitate the replacement of defective components on one or more fabricated devices, thereby resulting in a single operable electronic device. The invention may be used to increase the production yield of electronic devices, particularly, semiconductor integrated circuits. The invention permits the fabrication of discretionary wiring during the normal metalization of semiconductor layers to interconnect electronic devices at the same time as the formation of the normal wiring/circuitry of the devices.

13 Claims, 4 Drawing Sheets

METHOD AND APPARATUS FOR FABRICATING ELECTRONIC DEVICE

This is a continuation of application Ser. No. 09/396,439 filed Sep. 15, 1999 now U.S. Pat. No. 6,326,245 which is a divisional of application Ser. No. 09/039,230, filed Mar. 16, 1998, now U.S. Pat. No. 6,093,933 granted Jul. 25, 2000, entitled "METHOD AND APPARATUS FOR FABRICATING ELECTRONIC DEVICE," by Warren M. Farnworth et al.

BACKGROUND OF THE INVENTION

1. Field of the Invention

The invention is directed to the field of manufacturing electronic devices. More specifically, the invention is directed to methods and apparatus used to increase yield during fabrication of electronic devices.

2. Description of Related Art

In order to increase the yield (i.e., the ratio of good devices to the total number of devices available) during the manufacture of electronic devices such as semiconductor integrated circuits, redundant blocks or sections (e.g., memory elements) which are substantially similar in function and/or structure to components on the electronic device are incorporated into the manufactured device. These redundant blocks can be substituted for defective blocks to salvage an otherwise inoperable device. The substitution of these redundant blocks, however, requires overhead circuitry used to test and substitute the redundant blocks. As integrated circuits become more dense, such added circuitry required to access the redundant blocks becomes excessive.

An alternative to the use of such redundant circuitry is known as "discretionary wiring." According to this concept, a semiconductor wafer 10 (FIG. 1) contains small, similar semiconductor devices or clusters of devices 12 which are manufactured using traditional batch processing methods. Before these clusters are interconnected, however, they are tested and a map of good and bad elements 12 on the wafer 10 is created. For each wafer 10, a set of unique masks for the interconnect patterns (i.e., "discretionary wiring") is created and metallic conductive strips 18 (FIG. 2) are fabricated on the wafer 10 to interconnect all the good elements 12 into a single functional integrated circuit.

A process that employs discretionary wiring by preparing unique masks for the interconnect layer of the semiconductor device is shown in U.S. Pat. Nos. 3,771,217 and 5,691,949. Preparing a unique interconnect pattern using a separate masking step can be a costly and time intensive operation.

SUMMARY OF THE INVENTION

In fabricating electronic devices using discretionary wiring to increase production yield, the invention eliminates the extra manufacturing step of preparing a unique pattern or mask to fabricate the discretionary wiring. Instead, conductive paths interconnecting electronic devices are provided at the same time as the formation of the normal wiring/circuitry of the devices. Thus, by deploying discretionary wiring during the current metalization or formation of other conductive paths during fabrication of integrated circuits, for example, the invention takes advantage of the existing mask steps used to develop the normal integrated circuit elements (e.g., DRAM capacitor, metal lines, etc.).

Logic circuitry formed in street areas between adjacent fabricated electronic devices may be used as auxiliary or redundant components to salvage one or more otherwise defective devices. In accordance with the invention, such logic circuitry is selectively coupled to the defective device(s) so as to directly replace or facilitate the replacement of defective components on one or more fabricated devices, thereby resulting in a single operable electronic device.

BRIEF DESCRIPTION OF THE DRAWINGS

The foregoing and other advantages of the invention will become more apparent from the detailed description of preferred embodiments of the invention given below with reference to the accompanying drawings in which.

DETAILED DESCRIPTION OF PREFERRED EMBODIMENTS

The invention will be described in detail as set forth in the preferred embodiments illustrated in FIGS. 3 and 4. Although these embodiments depict the invention in its preferred application to the fabrication of a semiconductor memory device, the invention may be applicable to any type or configuration of semiconductor device (e.g., microprocessor, microcomputer, digital signal processor (DSP), etc.), as well as any other electronic device that encounters the same or similar problems.

The invention may best be described in relation to a preferred embodiment of the invention where it is applied to a process of manufacturing electronic devices in the form of semiconductor integrated circuits. In the exemplary embodiment discussed in detail herein, integrated circuit memories are fabricated on a wafer of silicon or other semiconductor material that may serve as a base for electronic devices. As shown in FIG. 3, a plurality of integrated circuit dies 12 are formed on the wafer substrate 10 in a manner well known in the art. The dies 12 are separated from each other by spaces 31, preferably, taking the form of strips of semiconductor material laid out generally in a grid or matrix of rows and columns. The spaces 31 are commonly referred to as the "street area" of the wafer.

Figure 1:
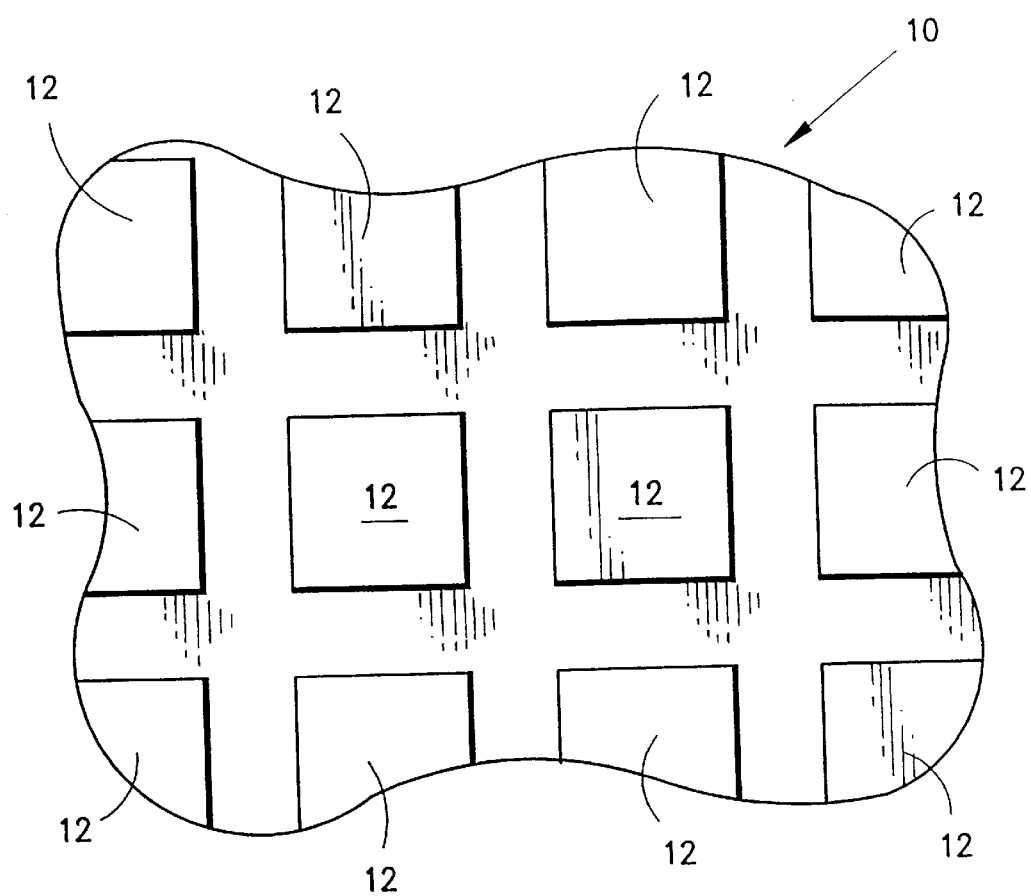
FIG. 1 illustrates a wafer having a plurality of integrated circuit (IC) dies.
Figure 2:
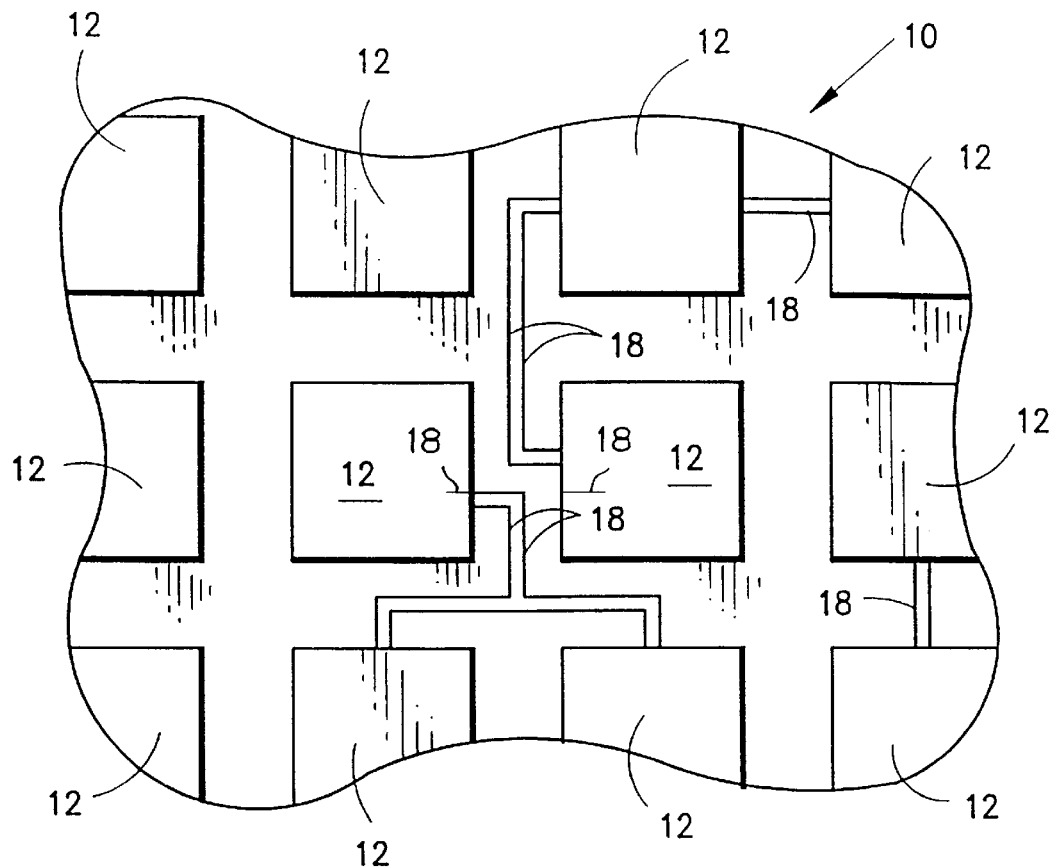
FIG. 2 illustrates a wafer having a plurality of IC dies interconnected with discretionary wiring fabricated from a separate mask layer.
Figure 3:
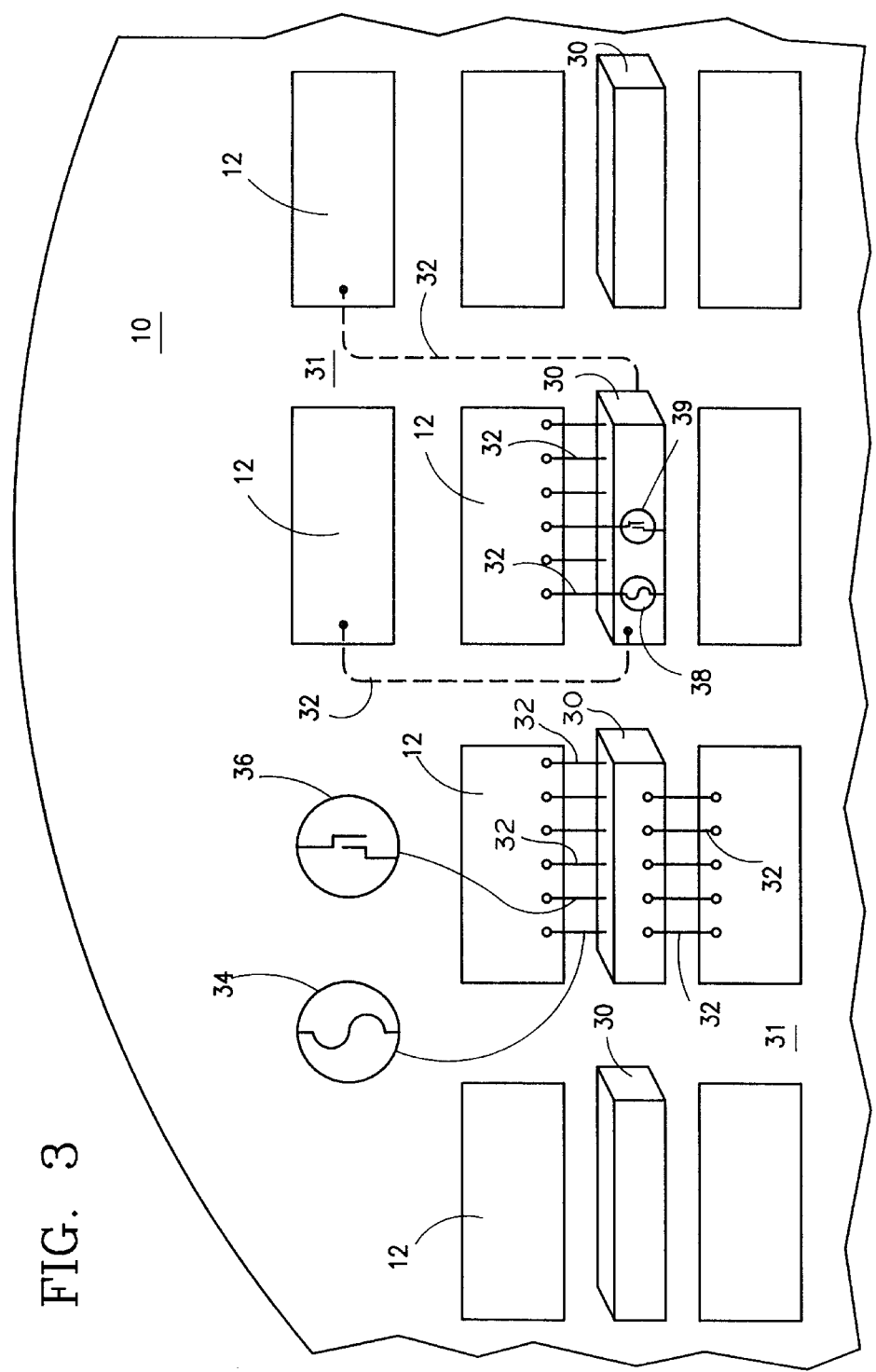
FIG. 3 illustrates a semiconductor wafer constructed in accordance with a preferred embodiment of the, invention.

As shown in FIG. 3, a plurality of auxiliary components 30 are formed in the wafer street area 31. The auxiliary components 30 may be one or more logic gates or other circuit components. In the preferred embodiment, logic devices which are programmable such as programmable logic arrays (PLAs) are used. The PLAs 30 are coupled to dies 12 through conductive paths 32, which may be metal lines or some other conductive material used to facilitate the transmission of signals between dies 12 and PLAs 30.

In accordance with the invention, the discretionary wiring of the system (described above) is emulated using the conductive paths 32, PLAs 30, or both. In particular, conductive paths 32 preferably embody selective links which provide changeable interconnections which are operative to disconnect or connect PLAs 30 to dies 12. Although fuses 34, anti-fuses 36, or both, may be used as selective links in conductive paths 32, any other equivalent structure may be used for this purpose. Similar fuses 38, anti-fuses 39, or both, may be employed in PLAs 30.

A detailed description of exemplary fuses and anti-fuses that may be employed is found in U.S. Pat. No. 5,324,681, assigned to Micron Technology, Inc., which is incorporated herein by reference in its entirety. Although only two selective links for conductive paths 32 and two links for PLA 30 are depicted in FIG. 3, the invention affords maximum flexibility in permitting any number (including zero) of selective links (e.g., fuses, anti-fuses, or both) to be used in conductive paths 32 and/or PLAs 30.

Figure 4:
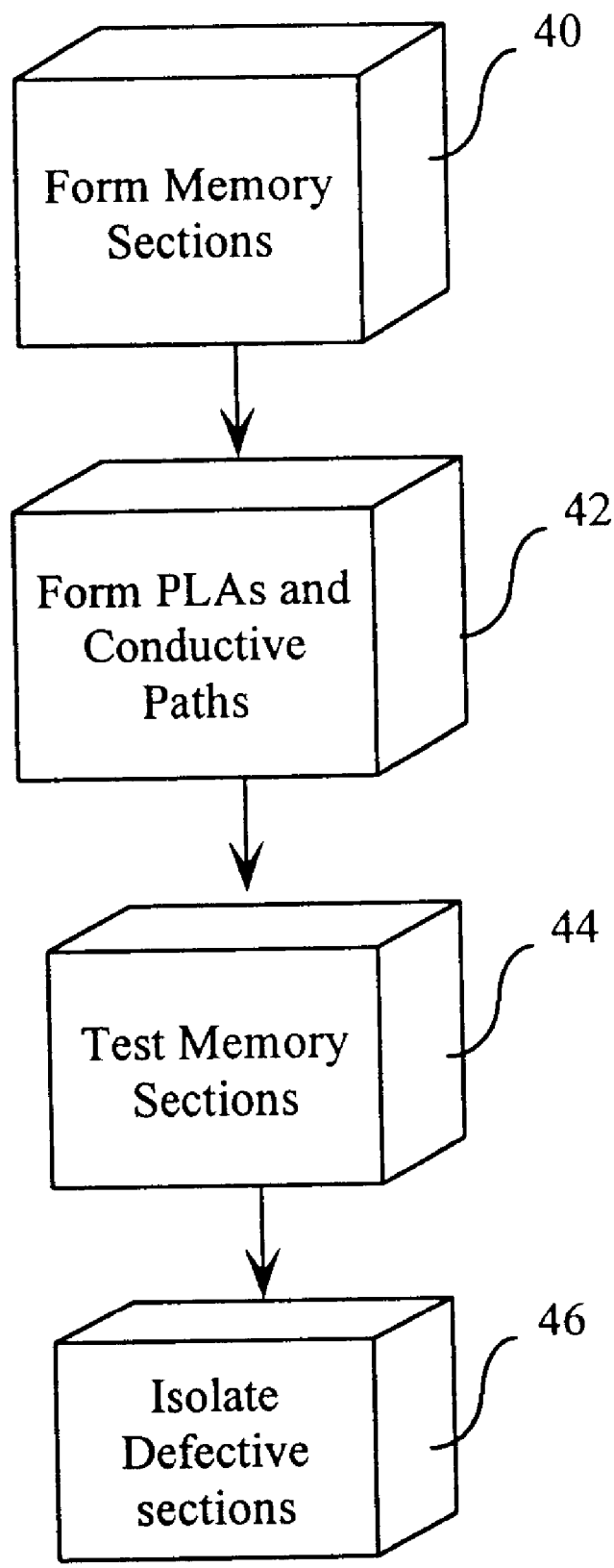
FIG. 4 shows a flow chart of a preferred method in A accordance with the invention.

Referring to FIG. 4, the method of making the wafer 3 shown in FIG. 3 is as follows. A plurality of integrated circuit components 12 (e.g., memory sections) are formed or patterned on a silicon semiconductor substrate 10 (step 40). Preferably, the plurality of dies 12 are substantially equally spaced having sufficient street area 31 formed on the wafer 10 to allow the formation of PLAs 30 and conductive paths 32 (step 42).

Each of the plurality of dies 12 is then tested using any of the known testing mechanisms in the art (step 44), and a map identifying good and bad dies 12 is created. Based on the identifying information in the map, selective links along the plurality of conductive paths 32 are blown (in the case of fusible links 24) or joined (in the case of anti-fusible links 36) to isolate the connection between defective dies 12 and corresponding PLAs 30 (step 46).

Any known technique of activating the selective links (e.g., applying voltage, current, laser beam, etc.) may be used to break or blow fuses (or join anti-fuses) so as to selectively couple/connect defective dies with auxiliary or redundant components. Having selectively coupled or connected a given defective die 12 to a corresponding PLA 30 in this manner, the corresponding PLA 30 can offer its logic circuitry (e.g., redundant memory cell) to the defective die 12 as a surrogate component that helps salvage the otherwise defective die 12.

As stated above, the logic circuitry (shown as PLA 30 in FIG. 3) may be a redundant component substantially similar to the defective component(s) of die 12 in terms of function, structure, or both. The logic circuitry 30 may also be one or more logic gates (e.g., AND gates, adders, multipliers, etc.) used to perform the same function and/or provide the structure found defective in die 12. The logic circuitry 30 may further be operable to combine the functions and/or structures of two or more otherwise defective dies 12 into a single operable device.

While the invention has been described in detail in connection with the best mode of the invention known at the time, it should be readily understood that the invention is not limited to the specified embodiments described. Rather, the invention can be modified to incorporate any number of variations, alterations, substitutions or equivalent arrangements not heretofore described, but that are commensurate with the spirit and scope of the invention.

For example, the conductive paths 32 preferably coupling PLAs 30 to adjacent ones of dies 12 may also be used to couple PLAs 30 to dies 12 beyond the immediately surrounding adjacent dies 12, as shown by dashed lines 32 in FIG. 3. In addition, the fuse/anti-fuse links 34, 36 found in conductive paths 32 may be replaced (or supplemented) by fusible links 38 or anti-fusible links 39 incorporated in logic circuitry 30.

In view of the many modifications which can be made, the nature, spirit and scope of the invention is not limited by the foregoing descriptions but should only be limited by the scope of the claims appended hereto.

What is claimed as new and desired to be protected by Letters Patent of the United States is:

1. A method of preparing a base for electronic devices, comprising spacing a plurality of integrated circuit devices apart from each other on the base, wherein at least one of the integrated circuit devices being defective, forming logic circuitry in a street area separating integrated circuit devices, selectively coupling the logic circuitry to the at least one defective integrated circuit device, and restoring the at least one defective integrated circuit device to an operable state using the logic circuitry.

2. The method of preparing a base as recited in claim 1, wherein the integrated circuit devices are semiconductor integrated circuits.

3. The method of preparing a base as recited in claim 2, wherein the base is a wafer of silicon.

4. The method of preparing a base as recited in claim 3, further comprising forming the integrated circuit devices as integrated circuit dies on the wafer separated by street area in form of strips of semiconductor material substantially laid out in a matrix of rows and columns.

5. The method of preparing a base as recited in claim 1, further comprising coupling the logic circuitry in the street area to the at least one defective integrated circuit device through conductive paths.

6. The method of preparing a base as recited in claim 5, further comprising providing changeable interconnections through selective links in the conduct paths operative to selectively connect the logic circuitry to the at least one defective integrated circuit device.

7. The method of preparing a base as recited in claim 6, further comprising providing fuses and anti-fuses as the selective links in the conductive paths.

8. The method of preparing a base as recited in claim 1, further comprising testing the plurality of integrated circuit devices to determine a defect.

9. The method of preparing a base as recited in claim 8, further comprising creating a map identifying defective integrated circuit devices.

10. The method of preparing a base as recited in claim 9, further comprising isolating connections between the logic circuitry and the at least one defective integrated circuit device based on identifying information in the map.

11. The method of preparing a base as recited in claim 10, further comprising performing in the logic circuitry the function found to be defective in the at least one defective integrated circuit device so as to restore operation of the at least one defective integrated circuit device.

12. The method of preparing a base as recited in claim 11, wherein the logic circuitry contains at least one redundant component substantially similar to a defective component in the at least one defective integrated circuit device.

13. The method of preparing a base as recited in claim 11, wherein the logic circuitry contains programmable logic arrays.

* * * * *